United States Patent
Yamane et al.

(10) Patent No.: US 9,340,705 B2
(45) Date of Patent: May 17, 2016

(54) FLUORINE-BASED SURFACE TREATING AGENT FOR VAPOR DEPOSITION AND ARTICLE FINISHED WITH THE SURFACE TREATING AGENT BY VAPOR DEPOSITION

(71) Applicant: Shin-Etsu Chemical Co., Ltd., Chiyoda-ku (JP)

(72) Inventors: Yuji Yamane, Annaka (JP); Noriyuki Koike, Annaka (JP)

(73) Assignee: Shin-Etsu Chemical Co., Ltd., Chiyoda-ku (JP)

( * ) Notice: Subject to any disclaimer, the term of this patent is extended or adjusted under 35 U.S.C. 154(b) by 608 days.

(21) Appl. No.: 13/684,289

(22) Filed: Nov. 23, 2012

(65) Prior Publication Data
US 2013/0136928 A1    May 30, 2013

(30) Foreign Application Priority Data
Nov. 30, 2011    (JP) .................................. 2011-261590

(51) Int. Cl.
| | | |
|---|---|---|
| C09D 171/00 | (2006.01) | |
| C09D 171/02 | (2006.01) | |
| C09D 5/16 | (2006.01) | |
| C09D 183/00 | (2006.01) | |
| C09D 183/06 | (2006.01) | |
| C23C 16/00 | (2006.01) | |
| G02B 1/10 | (2015.01) | |
| C03C 17/23 | (2006.01) | |
| C03C 17/30 | (2006.01) | |
| C03C 17/32 | (2006.01) | |
| C03C 17/42 | (2006.01) | |
| H01L 21/02 | (2006.01) | |
| H01L 21/461 | (2006.01) | |
| H01L 21/47 | (2006.01) | |
| C08L 71/00 | (2006.01) | |
| C08L 71/02 | (2006.01) | |
| C08L 83/00 | (2006.01) | |
| C08L 83/06 | (2006.01) | |
| B32B 17/10 | (2006.01) | |
| B32B 27/28 | (2006.01) | |
| C09D 183/16 | (2006.01) | |
| C09D 183/12 | (2006.01) | |
| C08G 71/02 | (2006.01) | |
| C08G 71/00 | (2006.01) | |
| C08G 83/00 | (2006.01) | |
| C08G 65/333 | (2006.01) | |
| C08G 65/00 | (2006.01) | |
| C08G 77/46 | (2006.01) | |
| G02B 1/18 | (2015.01) | |
| C08G 77/24 | (2006.01) | |

(52) U.S. Cl.
CPC ............ *C09D 183/16* (2013.01); *C09D 183/12* (2013.01); *B32B 17/10715* (2013.01); *B32B 27/285* (2013.01); *B32B 2255/26* (2013.01); *B32B 2307/73* (2013.01); *B32B 2315/08* (2013.01); *B32B 2371/00* (2013.01); *B32B 2383/00* (2013.01); *B32B 2457/208* (2013.01); *C03C 17/23* (2013.01); *C03C 17/30* (2013.01); *C03C 17/32* (2013.01); *C03C 17/42* (2013.01); *C08G 65/007* (2013.01); *C08G 65/3332* (2013.01); *C08G 65/33303* (2013.01); *C08G 71/00* (2013.01); *C08G 71/02* (2013.01); *C08G 77/24* (2013.01); *C08G 77/46* (2013.01); *C08G 83/00* (2013.01); *C08G 2650/48* (2013.01); *C08L 83/00* (2013.01); *C08L 83/06* (2013.01); *C09D 5/16* (2013.01); *C09D 171/00* (2013.01); *C09D 171/02* (2013.01); *C09D 183/00* (2013.01); *C09D 183/06* (2013.01); *C23C 16/00* (2013.01); *G02B 1/10* (2013.01); *G02B 1/18* (2015.01); *H01L 21/0226* (2013.01); *H01L 21/461* (2013.01); *H01L 21/47* (2013.01); *Y10T 428/315* (2015.01); *Y10T 428/3154* (2015.04)

(58) Field of Classification Search
None
See application file for complete search history.

(56) References Cited

U.S. PATENT DOCUMENTS

| | | | | |
|---|---|---|---|---|
| 5,030,478 A | * | 7/1991 | Lin ........................ | G11B 5/725 427/130 |
| 6,183,872 B1 | * | 2/2001 | Tanaka et al. ................. | 428/429 |
| 6,277,485 B1 | * | 8/2001 | Invie et al. ..................... | 428/336 |
| 7,196,212 B2 | | 3/2007 | Yamaguchi et al. | |
| 7,294,731 B1 | * | 11/2007 | Flynn et al. .................... | 556/427 |
| 7,981,471 B2 | * | 7/2011 | Mitsuishi et al. ........... | 427/248.1 |
| 8,268,067 B2 | * | 9/2012 | Iyer et al. ................. | 106/287.11 |
| 8,900,711 B2 | * | 12/2014 | Yamane et al. ................ | 428/421 |
| 8,906,547 B2 | * | 12/2014 | Taniguchi et al. ............. | 429/213 |

(Continued)

FOREIGN PATENT DOCUMENTS

| | | |
|---|---|---|
| EP | 1 387 187 A1 | 2/2004 |
| EP | 2 078 224 A1 | 7/2009 |

(Continued)

OTHER PUBLICATIONS

"Solvay—Fomblin PFPE Lubricants" (2014).*

(Continued)

*Primary Examiner* — Vivian Chen
(74) *Attorney, Agent, or Firm* — Oblon, McClelland, Maier & Neustadt, L.L.P.

(57) ABSTRACT

There is disclosed a fluorine-based surface treating agent for vapor deposition comprising (A) a hydrolyzable group-containing silane modified with a polymer containing a fluorooxyalkylene group and/or a partial hydrolytic condensate, and (B) a polymer containing a fluorooxyalkylene group having a higher weight average molecular weight than component (A), wherein components (A) and (B) are mixed in a weight ratio of from 6:4 to 9:1.

12 Claims, No Drawings

(56) References Cited

U.S. PATENT DOCUMENTS

| | | | |
|---|---|---|---|
| 2002/0094738 A1* | 7/2002 | Ishii | C08L 25/06 |
| | | | 442/81 |
| 2003/0139620 A1* | 7/2003 | Yamaguchi et al. | 556/445 |
| 2003/0181044 A1* | 9/2003 | Takahashi et al. | 438/689 |
| 2004/0021966 A1 | 2/2004 | Takahashi et al. | |
| 2004/0047047 A1* | 3/2004 | Yamaguchi et al. | 359/666 |
| 2005/0168685 A1* | 8/2005 | Katagiri et al. | 351/159 |
| 2005/0233070 A1* | 10/2005 | Pellerite et al. | 427/164 |
| 2007/0149746 A1* | 6/2007 | Yamane et al. | 528/42 |
| 2008/0286457 A1* | 11/2008 | Mitsuishi et al. | 427/164 |
| 2009/0011255 A1* | 1/2009 | Komai et al. | 428/447 |
| 2009/0012220 A1* | 1/2009 | Yamane et al. | 524/300 |
| 2009/0232432 A1* | 9/2009 | Egami | C10M 161/00 |
| | | | 384/464 |
| 2009/0232978 A1* | 9/2009 | Suzuki et al. | 427/162 |
| 2010/0053547 A1 | 3/2010 | Baude et al. | |
| 2011/0098402 A1 | 4/2011 | Yamane et al. | |
| 2012/0270057 A1* | 10/2012 | Yamane et al. | 428/429 |
| 2013/0108876 A1* | 5/2013 | Komori et al. | 428/421 |
| 2014/0113145 A1* | 4/2014 | Yamane et al. | 428/422 |
| 2015/0275046 A1* | 10/2015 | Yamane | C09D 183/14 |
| | | | 428/429 |

FOREIGN PATENT DOCUMENTS

| | | | |
|---|---|---|---|
| EP | 2 316 869 A1 | | 5/2011 |
| JP | 2003-238577 | | 8/2003 |
| JP | 2005-187936 | * | 7/2005 |
| JP | 2006-197546 | * | 7/2006 |
| WO | WO 2009/151141 A1 | | 12/2009 |

OTHER PUBLICATIONS

Extended European Search Report issued Oct. 8, 2014 in Patent Application No. 12008022.1.

* cited by examiner

FLUORINE-BASED SURFACE TREATING AGENT FOR VAPOR DEPOSITION AND ARTICLE FINISHED WITH THE SURFACE TREATING AGENT BY VAPOR DEPOSITION

CROSS-REFERENCE TO RELATED APPLICATION

This non-provisional application claims priority under 35 U.S.C. §119(a) on Patent Application No. 2011-261590 filed in Japan on Nov. 30, 2011, the entire contents of which are hereby incorporated by reference.

TECHNICAL FIELD

The present invention relates to a surface treating agent which contains a silane modified with a polymer containing a fluorooxyalkylene group. More particularly, the present invention relates to a surface treating agent which forms a coating film being excellent in water- and oil-repellency and having a low coefficient of dynamic friction and also to an article finished with the surface treating agent. The surface treating agent according to the present invention is composed of, in a specific ratio, a silane modified with a polymer containing a fluorooxyalkylene group and/or a partial hydrolytic condensate thereof and a polymer containing a fluorooxyalkylene group having a higher weight average molecular weight.

BACKGROUND ART

There has recently been an accelerated trend toward the replacement of displays on mobile phones by those of touch panel type. Unfortunately, the display of touch panel type has the disadvantage of becoming easily soiled with sebum etc. because it is usually bare and subject to direct contact with the fingers and cheeks of the user. Thus there is a growing demand for technologies to protect the display from soiling with fingerprints and to make the display easily cleanable, thereby improving appearance and visibility. This demand is fulfilled by any conventional water- and oil-repellent that forms an easy-to-clean film having good water- and oil-repellency. Such a conventional product, however, has the disadvantage of greatly varying in durability from one batch of film to another. Moreover, it involves difficulties in forming a smooth film due to agglomeration of particles therein. This has stimulated the development of a new surface treating agent and a method of invariably forming a high-performance coating film.

In the meantime, any compound containing fluorooxyalkylene groups generally exhibits water- and oil-repellency, chemical resistance, lubricity, releasability, and stain resistance on account of its very low surface free energy. Thanks to these properties, it finds a variety of industrial uses as water- and oil-repellent stain-resistant agents for paper and fiber, slip agents for magnetic recording media, oil protectants for precision machines, mold release agents, cosmetics, and protective film. On the other hand, the aforesaid properties imply nonadherence to substrates, and hence the aforesaid compound can be applied to the substrate surface but the resulting coating film does not firmly adhere to the substrate surface.

By the way, among well-known agents to bind an organic compound to a substrate such as glass and cloth are silane coupling agents, which are in general use for coating on the surface of various substrates. Any silane coupling agent has organic functional groups and reactive silyl groups (usually alkoxysilyl groups) in one molecule. The alkoxysilyl groups undergo the self-condensation reaction induced by moisture in air, thereby forming a coating film. This coating film is durable and strong because of the chemical and physical bonding of alkoxysilyl groups to the surface of glass or metal.

One example of the coupling agents having the alkoxysilyl groups as mentioned above is disclosed in Patent Document 1 (JP-A 2003-238577). It is a silane modified with a polymer containing linear perfluorooxyalkylene groups represented by the formula below. This silane is used for surface treatment of glass and antireflective film. The treated glass or film is superior in slipperiness, releasability, and wear resistance, but lacks stable high-performance properties. The lack of durability is due to the presence of non-fluorine groups on the molecular terminals, the non-fluorine groups being liable to agglomeration during or after the coating process.

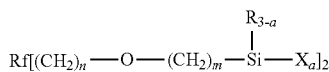

wherein Rf is a divalent linear perfluorooxyalkylene group; R is an alkyl group or a phenyl group having 1 to 4 carbon atoms; X is a hydrolyzable group; n is an integer of 0 to 2; m is an integer of 1 to 5; and a is 2 or 3.

SUMMARY OF THE INVENTION

Technical Problem

The present invention was completed in view of the foregoing. It is an object of the present invention to provide a fluorine-based surface treating agent for vapor deposition, which invariably forms a high-performance water- and oil-repellent film, and an article finished with the surface treating agent by vapor deposition.

Solution to Problem

Conventional technologies that employ a fluorine-based surface treating agent having hydrolyzable groups involve a preliminary step of forming an $SiO_2$ layer as a primer coating on the substrate prior to its application. The method for application in this case is vacuum vapor deposition rather than dipping, because the former is more suitable for durable coating than the latter as known well.

As mentioned above, the present inventors had proposed a silane modified with a polymer containing linear perfluorooxyalkylene groups, the polymer having hydrolyzable groups on both terminals (See Patent Document 1: JP-A 2003-238577). The polymer-modified silane as a surface treating agent needs adequately controlled processing conditions so as to form high-performance coating film because its molecules are liable to agglomeration.

The polymer having the fluorooxyalkylene structure in the main chain and containing hydrolyzable groups on both terminals of the molecular chain, is liable to agglomeration induced by mutual reaction between alkoxysilyl groups. This agglomeration gives rise to surface irregularities larger than the thickness (at least 10 nm) of monomolecular layer, as proven by observations of a deposited film under an atomic force microscope. This holds true also in the case of a surface treating agent having functional groups only on one terminal.

In order to tackle the foregoing problems, the present inventors carried out a thorough investigation, which led to the finding that the fluorine-based surface treating agent containing a polymer which has hydrolyzable groups on its terminals and also has the fluorooxyalkylene structure in its main chain becomes free of agglomeration upon addition with a non-functional polymer. This finding is the basis of the present invention.

Thus, the present invention provides a fluorine-based surface treating agent for vapor deposition as defined below and an article finished with the surface treating agent.

More specifically, the present invention provides a fluorine-based surface treating agent for vapor deposition comprising (A) a hydrolyzable group-containing silane modified with a polymer containing a fluorooxyalkylene group and/or a partial hydrolytic condensate, and (B) a polymer containing a fluorooxyalkylene group having a higher weight average molecular weight than component (A), wherein components (A) and (B) are mixed in a weight ratio of from 6:4 to 9:1.

Preferably, the ratio between the weight average molecular weight of component (A) and the weight average molecular weight of component (B) ranges from 1:1.5 to 1:5.

Also preferably, the residue of the fluorooxyalkylene group-containing polymer modifying the silane of component (A) has 3 to 151 recurring units shown in the general formula (1):

  (1)

wherein g is an integer of 1 to 6 which is independent for each recurring unit, and the fluorooxyalkylene group-containing polymer of component (B) has 5 to 755 recurring units of formula (1).

Preferably, the silane of component (A) is one represented by the general formula (2):

$$Rf\text{-}[Q\text{-}X]_a \quad (2)$$

wherein Rf is a monovalent fluorooxyalkyl group or a divalent fluorooxyalkylene group, Q is a divalent organic group which joins the Rf group and the X group together, X is a monovalent organic group having a hydrolyzable group-bonded silane and a plurality of hydrolyzable groups, and letter a is 1 or 2.

In this case, in formula (2), Rf is preferably one selected from the group consisting of the following general formulas (3), (4) and (5) when letter a is 1:

  (3)

wherein Y is independently F or $CF_3$ group, m is an integer of 3 to 150, and d' is an integer of 1 to 3, $$C_3F_7O(CF_2CF_2CF_2O)_m C_{d'}F_{2d'}\text{—} \quad (4)$$

wherein m is an integer of 3 to 150 and d' is an integer of 1 to 3, and

  (5)

wherein Y is independently F or $CF_3$ group, Z is H or F, p and q each is an integer of 0 to 150, p+q is 3 to 150, d is an integer of 1 to 3, and the recurring units may be randomly joined together. Or, Rf is preferably one selected from the group consisting of the following general formulas (6), (7) and (8) when letter a is 2:

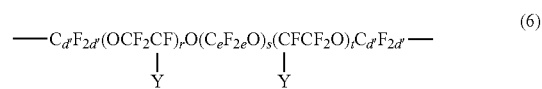  (6)

wherein Y is independently F or $CF_3$ group, d' is independently an integer of 1 to 3, e is an integer of 2 to 6, each of r and t is an integer of 0 to 150, s is an integer of 0 to 6, and r+t+s is 3 to 150, and the recurring units may be randomly joined together,

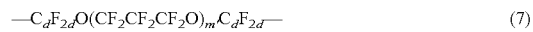  (7)

wherein m' is an integer of 3 to 150 and d is an integer of 1 to 3, and

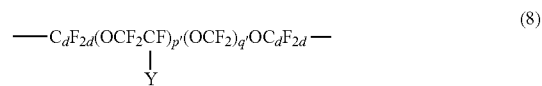  (8)

wherein Y is independently F or $CF_3$ group, d is independently an integer of 1 to 3, each of p' and q' is an integer of 0 to 150, and p'+q' is 3 to 150, and the recurring units may be randomly joined together.

In formula (2), Q is preferably an unsubstituted or substituted divalent hydrocarbon group having 2 to 12 carbon atoms which may contain at least one structure selected from the group consisting of amide linkage, ether linkage, ester linkage, vinyl linkage, and diorganosilylene group. More preferably, Q is one selected from the group consisting of divalent groups having the following formulas:

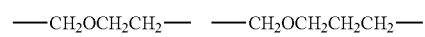
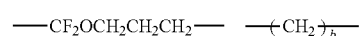
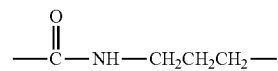
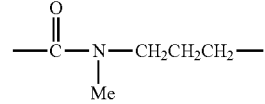
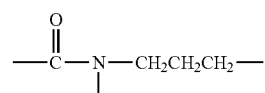
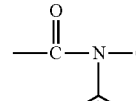

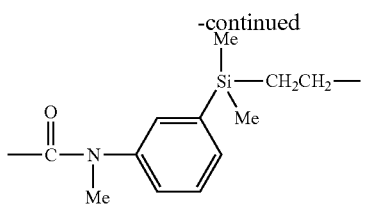

wherein letter b is an integer of 2 to 4 and M is methyl group.

In formula (2), X is preferably a hydrolyzable silyl group, or a linear, branched or cyclic siloxane group or silyl group having a hydrolyzable silyl group or hydrolyzable silylalkylene group. More preferably, X is a group having an alkoxy group-bonded silyl group represented by any one of the following formulas:

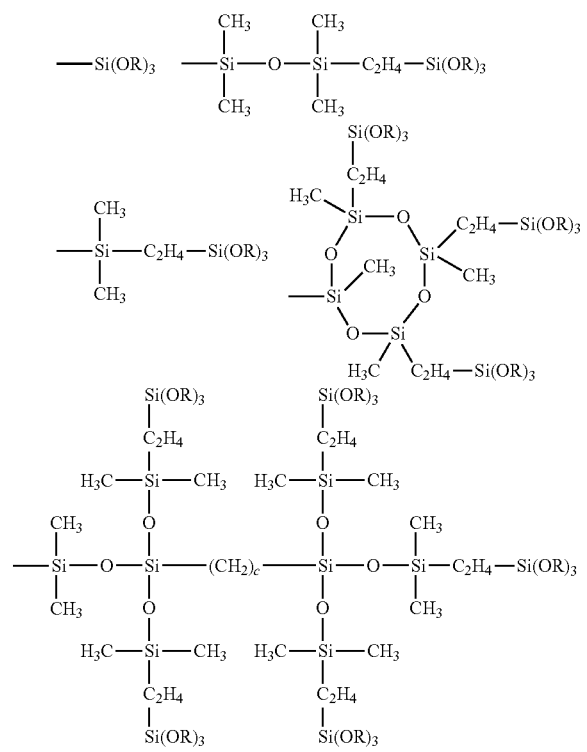

wherein letter c is an integer of 2 to 6, and OR is an alkoxy group having 1 to 10 carbon atoms, an alkoxyalkoxy group having 2 to 10 carbon atoms, an alkenyloxy group having 2 to 10 carbon atoms, or an acyloxy group having 1 to 10 carbon atoms.

Preferably, the fluorooxyalkylene group-containing polymer of component (B) is one selected from the group consisting of polymers having the following formulas (9) to (12):

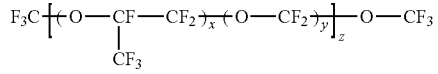
(9)

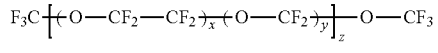
(10)

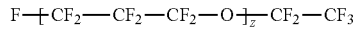
(11)

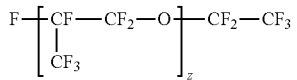
(12)

wherein x, y and z are values satisfying that the weight average molecular weight of the fluorooxyalkylene group-containing polymer is 1,500 to 20,000.

The surface treating agent may further comprise a fluorine-modified ether solvent or a fluorine-modified aromatic hydrocarbon solvent.

The present invention also provides an article treated by vapor deposition with the above-described surface treating agent. Examples of the article include an optical article, a touch panel, antireflective film, $SiO_2$-treated glass and tempered glass.

Advantageous Effects of Invention

The surface-treating agent including a hydrolyzable group-containing silane modified with a polymer containing a fluorooxyalkylene group and/or a partial hydrolytic condensate thereof, and a polymer containing a fluorooxyalkylene group having a higher weight average molecular weight according to the present invention forms a smooth water- and oil-repellent coating film on a substrate treated therewith by vapor deposition. The surface-treating agent according to the present invention also imparts good stain resistance to a variety of articles treated therewith by vapor deposition. The treated articles are protected from chemical attack and staining over a long period of time.

DESCRIPTION OF EMBODIMENTS

According to the present invention, the fluorine-based surface treating agent for vapor deposition is a composition composed of (A) a hydrolyzable group-containing silane modified with a polymer containing a fluorooxyalkylene group and/or a partial hydrolytic condensate thereof and (B) a polymer containing a fluorooxyalkylene group having a higher weight average molecular weight than component (A), wherein components (A) and (B) are mixed in a ratio of from 6:4 to 9:1 by weight.

According to the present invention, the fluorine-based surface treating agent for vapor deposition is a composition composed of components (A) and (B) as mentioned above. It may be applied to $SiO_2$-treated glass (or glass coated with $SiO_2$ by vapor deposition or sputtering) by vapor deposition to give stain-resistant glass having a stable smooth water- and oil-repellent film which is superior to that obtained by vacuum deposition from component (A) alone.

Component (A) which is a hydrolyzable group-containing silane modified with a polymer containing a fluorooxyalkylene group should preferably be one represented by the formula (2) below.

$$Rf[-Q-X]_a \quad (2)$$

wherein Rf is a monovalent fluorooxyalkyl group or a divalent fluorooxyalkylene group; Q is a divalent organic group which joins the Rf group and the X group together; X is a monovalent organic group having a hydrolyzable group-bonded silane and a plurality of hydrolyzable groups; and a is 1 or 2.

In the formula (2), Rf is a monovalent fluorooxyalkyl group or a divalent fluorooxyalkylene group, and it should preferably be composed of the recurring units each represented by the formula (1) below.

$$-C_gF_{2g}O- \quad (1)$$

wherein g is an integer of 1 to 6 which may independently vary from one unit to another. The number of the recurring units should preferably be 3 to 151, more preferably 6 to 101, and most desirably 25 to 81. Each of the recurring units may vary in the value of g, and g should preferably be an integer of 1 to 4.

The recurring units represented by the formula above include the following examples. The exemplified recurring units may constitute the Rf group alone or in combination with one another.

—CF$_2$O—
—CF$_2$CF$_2$O—
—CF$_2$CF$_2$CF$_2$O—
—CF(CF$_3$)CF$_2$O—
—CF$_2$CF$_2$CF$_2$CF$_2$O—
—CF$_2$CF$_2$CF$_2$CF$_2$CF$_2$CF$_2$O—
—C(CF$_3$)$_2$O—

In the case where the formula (2) above is specified such that a is 1, the Rf composed of the above-mentioned recurring units should preferably be a monovalent fluorooxyalkyl group selected from the groups represented by the formulas (3), (4), and (5) below.

$$F(CFCF_2O)_mC_{d'}F_{2d'}- \\ | \\ Y \quad (3)$$

wherein Y is independently F or CF$_3$ group, m is an integer of 3 to 150, preferably 1 to 3, and d' is an integer of 1 to 3, preferably 2.

$$C_3F_7O(CF_2CF_2CF_2O)_mC_{d'}F_{2d'}- \quad (4)$$

wherein m is an integer of 3 to 150, preferably 10 to 100, and d' is an integer of 1 to 3, preferably 2.

$$ZCF_2(OCFCF_2)_p(OCF_2)_qOC_dF_{2d}- \\ | \\ Y \quad (5)$$

wherein Y is independently F or CF$_3$ group, Z is H or F, each of p and q is an integer of 0 to 150, preferably 10 to 40, p+q is 3 to 150, preferably 20 to 80, and d is an integer of 1 to 3, preferably 1, with the recurring units being joined together randomly if necessary.

In the case where the formula (2) above is specified such that a is 2, the Rf composed of the above-mentioned recurring units should preferably be a divalent fluorooxyalkylene group selected from the groups represented by the formulas (6), (7), and (8) below.

$$-C_{d'}F_{2d'}(OCF_2CF)_rO(C_eF_{2e}O)_s(CFCF_2O)_tC_{d'}F_{2d'}- \\ | \quad\quad\quad | \\ Y \quad\quad\quad Y \quad (6)$$

wherein Y is independently F or CF$_3$ group, d' is independently an integer of 1 to 3, preferably 2, e is an integer of 2 to 6, preferably 2 to 4, each of r and t is an integer of 0 to 150, preferably 20 to 40, s is an integer of 0 to 6, preferably 1 to 3, and r+t+s is 3 to 150, preferably 20 to 80, with the recurring units being joined together randomly if necessary.

$$-C_dF_{2d}O(CF_2CF_2CF_2O)_{m'}C_dF_{2d}- \quad (7)$$

wherein m' is an integer of 3 to 150, preferably 20 to 80, and d is an integer of 1 to 3, preferably 1.

$$-C_dF_{2d}(OCF_2CF)_{p'}(OCF_2)_{q'}OC_dF_{2d}- \\ | \\ Y \quad (8)$$

wherein Y is independently F or CF$_3$ group, d is independently an integer of 1 to 3, preferably 1, each of p' and q' is an integer of 0 to 150, preferably 20 to 40, and p'+q' is 3 to 150, preferably 20 to 80, with the recurring units being joined together randomly if necessary.

In the formula (2) above, Q is a divalent organic group which joins the Rf group and the X group together. It should be an unsubstituted or substituted divalent organic group having 2 to 12 carbon atoms, which may contain at least one structure selected from the group consisting of amide linkage, ether linkage, ester linkage, vinyl linkage, and diorganosilylene group (such as dimethylsilylene group), preferably an unsubstituted or substituted divalent hydrocarbon group having 2 to 12 carbon atoms, which may contain the above-mentioned structure.

Examples of the unsubstituted or substituted divalent hydrocarbon group having 2 to 12 carbon atoms include alkylene group (such as methylene group, ethylene group, propylene group (or trimethylene group and methylethylene group), butylene group (or tetramethylene group and methylpropylene group), hexamethylene group, and octamethylene group); arylene group (such as phenylene group); and combination of at least two groups (such as a combination of alkylene group and arylene group). They may or may not have the hydrogen atoms therein replaced partly or entirely by halogen atoms such as fluorine. Preferable among these examples are unsubstituted or substituted alkyl groups having 2 to 4 carbon atoms, and phenyl groups.

Typical examples of the divalent organic groups represented by Q are listed below.

—CH$_2$OCH$_2$CH$_2$—  —CH$_2$OCH$_2$CH$_2$CH$_2$—

—CF$_2$OCH$_2$CH$_2$CH$_2$—  —(CH$_2$)$_b$—

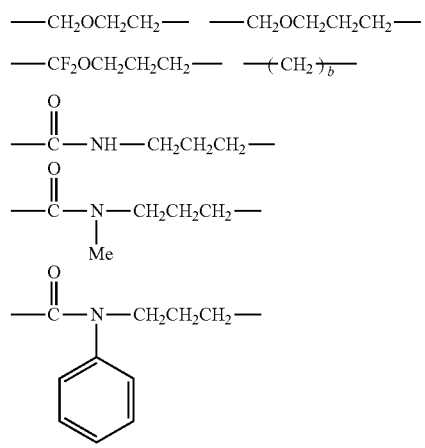

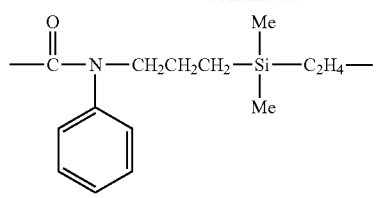

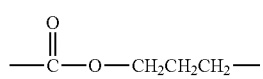

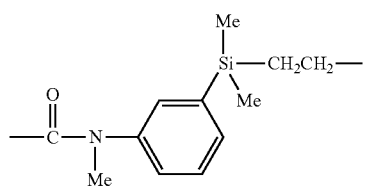

wherein b is an integer of 2 to 4, and Me is a methyl group.

In the formula (2) above, X is a monovalent organic group having a hydrolyzable group-containing silane which has as many hydrolyzable groups as 2 to 18, preferably 2 to 9. Examples of the hydrolyzable groups include alkoxyl groups having 1 to 10 carbon atoms (such as methoxy group, ethoxy group, propoxy group, and butoxy group), alkoxyalkoxyl groups having 2 to 10 carbon atoms (such as methoxymethoxy group and methoxyethoxy group), acyloxy groups having 1 to 10 carbon atoms (such as acetoxy group), alkenyloxy groups having 2 to 10 carbon atoms (such as isopropenoxy group), and halogen groups (such as chloro group, bromo group, and iodo group). Preferable among these examples are methoxy group, ethoxy group, isopropenoxy group, and chloro group).

The above-mentioned hydrolyzable group should preferably be one which is connected to the silicon atom. The monovalent organic group represented by X should preferably be a hydrolyzable silyl group or a linear, branched, or cyclic siloxane group or silyl group having the hydrolyzable silyl group or a hydrolyzable silylalkylene group.

Examples of the organic group (X) having hydrolyzable groups are listed below.

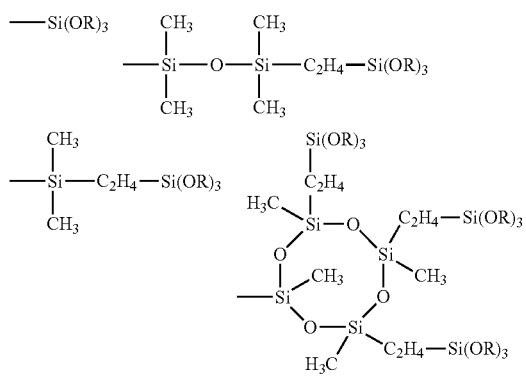

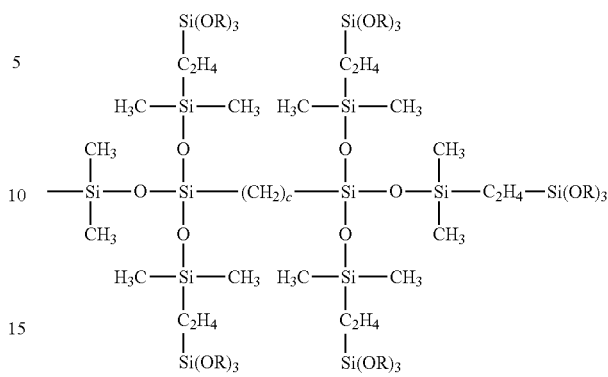

wherein c is an integer of 2 to 6, and OR is $C_{1-10}$ alkoxy group, $C_{2-10}$ alkoxyalkoxy group, $C_{2-10}$ alkenyloxy group, or $C_{1-10}$ acyloxy group.

The hydrolyzable groups may be different from each other. Among the OR groups, an alkoxy group such as methoxy group and ethoxy group is preferred.

The following are the examples of the silane modified with a polymer containing a fluorooxyalkylene group as represented by the formula (2) above in which the linking group Q is represented by the formula below

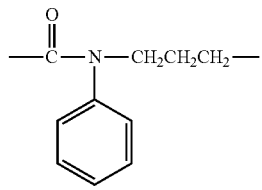

and the hydrolyzable group X is represented below.

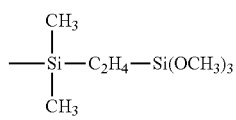

The combination of Q and X is not restricted to the one shown in the examples. A variety of polymer-modified silanes can be obtained simply by changing Q and X. Whatever surface treating agents with Q and X changed will produce the effect intended by the present invention.

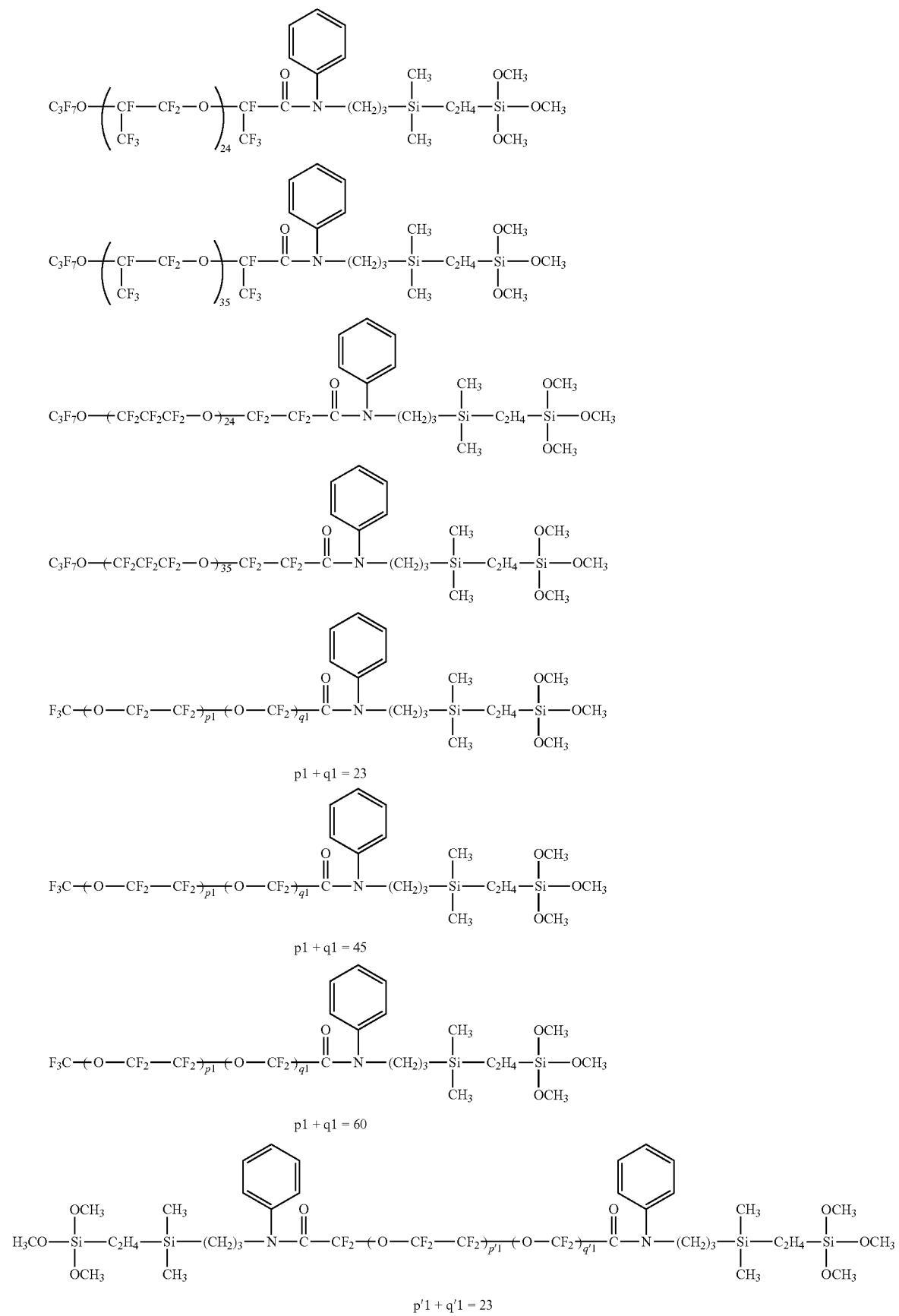

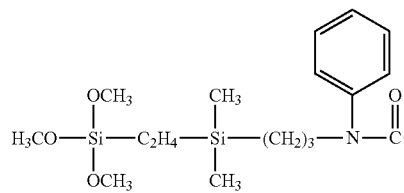 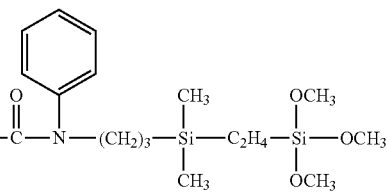
p'1 + q'1 = 45
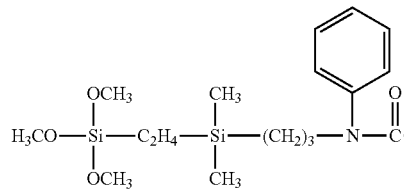 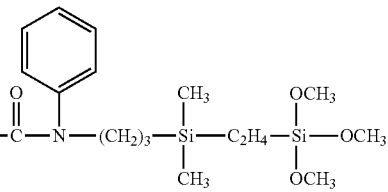
p'1 + q'1 = 60
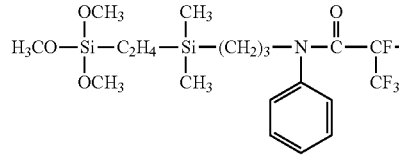 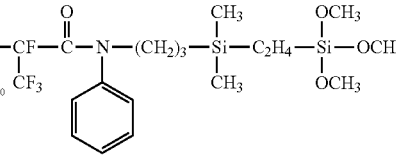
The following are the examples of the silane modified with a polymer containing a fluorooxyalkylene group as represented by the formula (2) above in which the groups Q and X are different from those mentioned above.
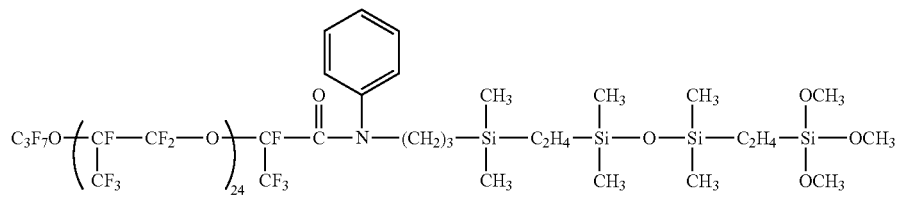
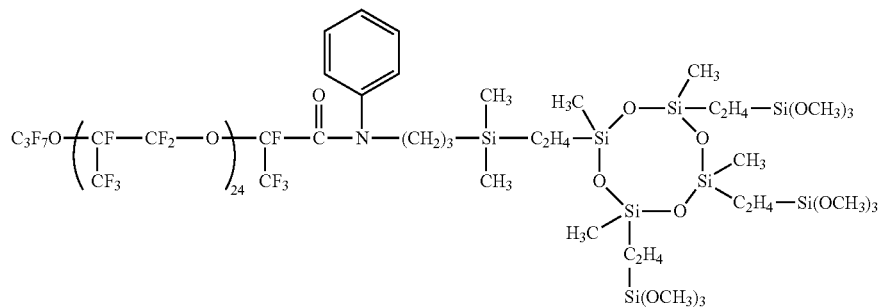
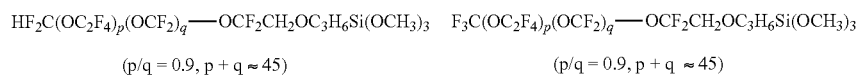
(p/q = 0.9, p + q ≈ 45)     (p/q = 0.9, p + q ≈ 45)
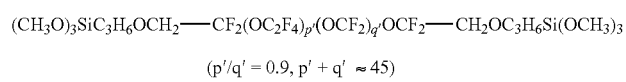
(p'/q' = 0.9, p' + q' ≈ 45)
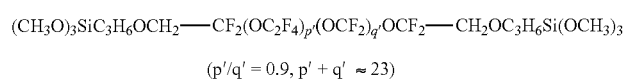
(p'/q' = 0.9, p' + q' ≈ 23)

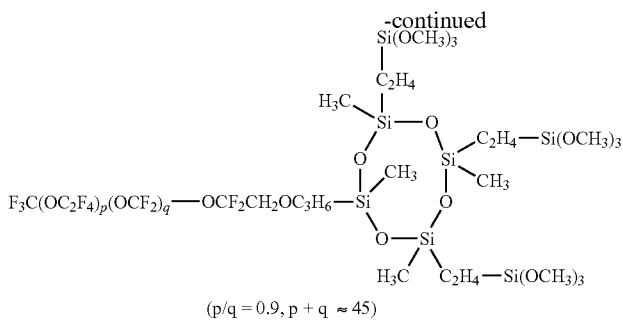

(p/q = 0.9, p + q ≈ 45)

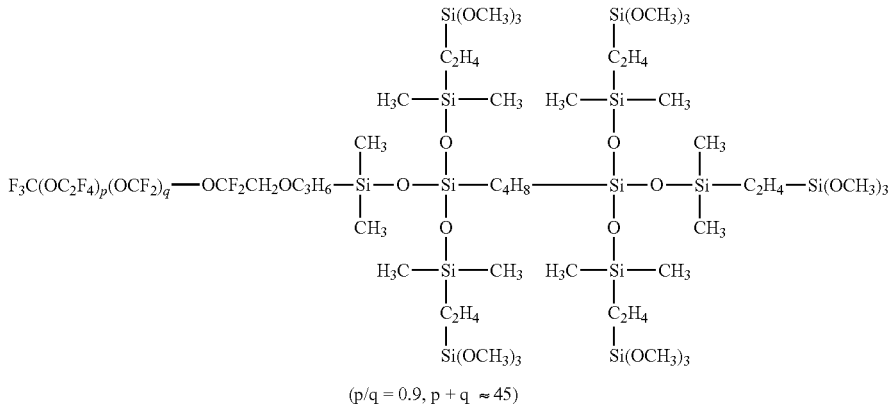

(p/q = 0.9, p + q ≈ 45)

According to the present invention, the fluorine-based surface treating agent for vapor deposition may optionally contain, as component (A), a partial hydrolytic condensate of the above-mentioned silane modified with a polymer containing a fluorooxyalkylene group. This condensate is obtained by partially hydrolyzing the terminal hydrolyzable groups of the silane by any known method and subsequently condensing the resulting partial hydrolyzate.

According to the present invention, the fluorine-based surface treating agent for vapor deposition should contain, as component (B), a polymer containing a fluorooxyalkylene group. This polymer should be highly compatible with component (A) or the silane modified with a polymer containing a fluorooxyalkylene group and/or a partial hydrolytic condensate thereof.

Component (B) or the polymer containing a fluorooxyalkylene group protects component (A) or the silane modified with a polymer containing a fluorooxyalkylene group and/or a partial hydrolytic condensate thereof from bumping at the time of vapor deposition. This leads to stable depositing operation. Moreover, component (B) prevents component (A) from agglomeration after vapor deposition, and this ensures efficient and complete coating on the substrate. Incidentally, component (B) should preferably be one which is free of silicon atoms.

Component (B) or the polymer containing a fluorooxyalkylene group has no terminal hydrolyzable groups and hence is incapable of reaction with the substrate. If it deposits earlier than component (A) or the silane modified with a polymer containing a fluorooxyalkylene group and/or a partial hydrolytic condensate thereof at the time of vapor deposition, the resulting coating film will be poor in durability.

This drawback can be removed if component (B) exceeds component (A) in weight average molecular weight by at least 1.5 times. Under this condition, component (A) deposits first and component (B) deposits subsequently at the time of vapor deposition.

The polymer containing a fluorooxyalkylene group as component (B) is composed of the recurring units represented by the formula (1) below.

$$-C_gF_{2g}O- \quad (1)$$

wherein g is an integer of 1 to 6 in each recurring unit. The number of the recurring units should preferably be 5 to 755, more preferably 5 to 300, and most desirably 10 to 115. In this case, the number of the recurring unit of formula (1) in component (B) is larger than that in component (A). Incidentally, the individual recurring units may vary in the value of g, which should preferably range from 1 to 4.

The recurring units represented by the foregoing formula include, for example, those which are represented by the following formulas. They may be used alone or in combination with one another.

—CF$_2$O—
—CF$_2$CF$_2$O—
—CF$_2$CF$_2$CF$_2$O—
—CF(CF$_3$)CF$_2$O—
—CF$_2$CF$_2$CF$_2$CF$_2$O—
—CF$_2$CF$_2$CF$_2$CF$_2$CF$_2$CF$_2$O—
—C(CF$_3$)$_2$O—

As the fluorooxyalkylene group-containing polymer of component (B), those having the following formulas (9) to (12) are preferably used.

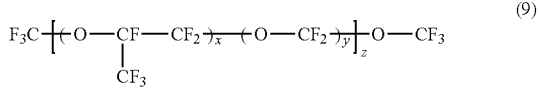

(9)

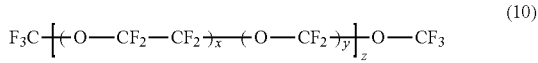

(10)

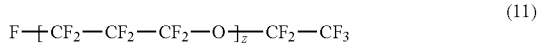

(11)

-continued

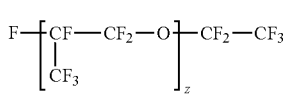
(12)

wherein x, y and z are values satisfying that the weight average molecular weight of the fluorooxyalkylene group-containing polymer is 1,500 to 20,000.

The polymer containing fluorooxyalkylene groups as component (B) may be commercially available under a trade name of FOMBLIN (from Solvay Solexis Inc.), DEMNUM (from Daikin Industrial Ltd.), and KRYTOX (from DuPont). Their typical examples are listed below together with their structural formulas.
FOMBLIN Y25 (weight average molecular weight=3,200) and
FOMBLIN Y45 (weight average molecular weight=4,100)

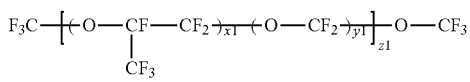

wherein x1, y1, and z1 are those values which satisfy the weight average molecular weight shown above.
FOMBLIN Z03 (weight average molecular weight=4,000),
FOMBLIN Z15 (weight average molecular weight=8,000), and
FOMBLIN Z25 (weight average molecular weight=9,500)

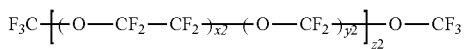

wherein x2, y2, and z2 are those values which satisfy the weight average molecular weight shown above.
DEMNUM S20 (weight average molecular weight=2,700),
DEMNUM S65 (weight average molecular weight=4,500), and
DEMNUM 5100 (weight average molecular weight=5,600)

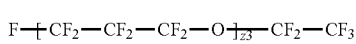

wherein z3 is the value which satisfies the weight average molecular weight shown above.
KRYTOX 143AB (weight average molecular weight=3,500),
KRYTOX 143AX (weight average molecular weight=4,700),
KRYTOX 143AC (weight average molecular weight=5,500), and
KRYTOX 143AD (weight average molecular weight=7,000)

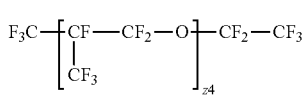

wherein z4 is the value which satisfies the weight average molecular weight shown above.

According to the present invention, the polymer containing a fluorooxyalkylene group (as component (B)) should has a weight average molecular weight suitable for vapor deposition, which is larger than that of the silane modified with a polymer containing a fluorooxyalkylene group and/or a partial hydrolytic condensate thereof (as component (A)), by at least 1.5 times, preferably at least 1.5 times and up to 5 times, from the standpoint of miscibility of the two components, more preferably at least 1.5 times and up to 4 times from the standpoint of handleability of the solution at the time of coating.

The weight average molecular weight of the polymer containing a fluorooxyalkylene group (as component (B)) is expressed in terms of that of polystyrene which is determined by gel permeation chromatography (GPC) that employs AK225 (made by ASAHI GLASS CO., LTD.) as an eluent. It is not specifically restricted within the foregoing range; however, it should preferably be 1,500 to 20,000, more preferably 2,000 to 10,000.

According to the present invention, the fluorine-based surface treating agent for vapor deposition should be composed of component (A) (or a hydrolyzable group-containing silane modified with a polymer containing a fluorooxyalkylene group and/or a condensate of partial hydrolyzate thereof) and component (B) (or a polymer containing a fluorooxyalkylene group) in a mixing ratio of from 6:4 to 9:1, preferably from 8:2 to 9:1. With component (A) in an excessive amount, the surface treating agent is liable to suffer agglomeration of silane. With component (B) in an excessive amount, the surface treating agent will be poor in curability.

The surface treating agent of the present invention may contain a solvent capable of uniformly dissolving components (A) and (B). Typical examples of the solvent include fluorine-modified aliphatic hydrocarbon solvents (such as perfluoroheptane and perfluorooctane), fluorine-modified aromatic hydrocarbon solvents (such as 1,3-trifluoromethylbenzene), fluorine-modified ether solvents (such as methylperfluorobutylether, ethyl perfluorobutyl ether, and perfluoro (2-butyltetrahydrofuran)), fluorine-modified alkylamine solvents (such as perfluorotributylamine and perfluorotriphentylamine), hydrocarbon solvents (such as petroleum benzine, toluene, and xylene), and ketone solvents (such as acetone, methyl ethyl ketone, and methyl isobutyl ketone). Of these examples, fluorine-modified solvents are preferable from the standpoint of solubility and wetting properties. Particularly preferable among them are fluorine-modified ether solvents and fluorine-modified aromatic hydrocarbon solvents.

These solvents may be used alone or in combination with one another.

The surface treating agent of the present invention may be incorporated with optional additives not harmful to its effect. Examples of such additives include those catalysts for hydrolysis and condensation which may be organotin compounds (such as dibutyltin dimethoxide and dibutyltin dilaurate), organotitanium compounds (such as tetra-n-butyl titanate), organic acids (such as fluorine-containing carboxylic acid, acetic acid, and methanesulfonic acid), and inorganic acids (such as hydrochloric acid and sulfuric acid). Preferable among these examples are fluorine-containing carboxylic acid, acetic acid, tetra-n-butyl titanate, and dibutyltin dilaurate. They should be added in a catalytic amount, which is usually 0.01 to 5 parts by weight, particularly 0.1 to 1 part by weight, for 100 parts by weight of component (A).

The surface treating agent of the present invention can be prepared from the foregoing components in prescribed amounts by uniform mixing.

The surface treating agent of the present invention can be applied to the substrate by any known process for vapor deposition. Vapor deposition may be accomplished by resistance heating or electron beam heating. Vapor deposition should be followed by curing at room temperature to 200° C., depending on the curing method. Moreover, curing should preferably be carried out in a humid atmosphere for accelerated reaction. The conditions for vapor deposition should be adequately selected for individual substrates such that the resulting coating film has a thickness of 0.1 to 30 nm, particularly 5 to 20 nm.

The surface treating agent of the present invention may be applied to substrates of any kind, such as paper, cloth, metal, metal oxide, glass, plastics, ceramics, and quarts, which are not specifically restricted. It imparts water- and oil-repellency to the foregoing substrates, and it is particularly suitable for $SiO_2$-treated glass and film.

Articles treated with the surface treating agent of the present invention include car navigation systems, tablet PCs, smart phones, mobile phones, digital cameras, digital video cameras, PDAs, portable audioplayers, car audio systems, game machines, eyeglass lenses, camera lenses, lens filters, sunglasses, gastroscopes (and other medical equipment), duplicating machines, PCs, liquid crystal displays, organic EL displays, plasma displays, touch panel displays, protective films, antireflective films, and other optical items. In addition, the surface treating agent of the present invention is particularly useful for touch panel displays and antireflective films as water- and oil-repellent because it is able to protect them from staining with fingerprints and sebum and make them scratch resistant.

EXAMPLES

The present invention will be described in more detail with reference to the following Examples and Comparative Examples which are not intended to restrict the scope thereof.

Examples 1 to 11 and Comparative Examples 1 to 9

Five compounds specified below were prepared as examples of the silane modified with a polymer containing a fluorooxyalkylene group.

Compound 1

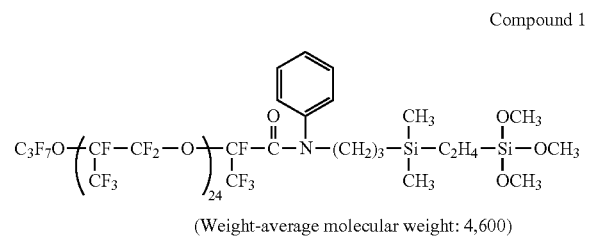

(Weight-average molecular weight: 4,600)

Compound 2
$HF_2C(OC_2F_4)_p(OCF_2)_q$—$OCF_2CH_2OC_3H_6Si(OCH_3)_3$
(p/q=0.9, p+q≈45, Weight-average molecular weight: 4,400)

Compound 3
$F_3C(OC_2F_4)_p(OCF_2)_q$—$OCF_2CH_2OC_3H_6Si(OCH_3)_3$
(p/q=0.9, p+q≈45, Weight-average molecular weight: 4,400)

Compound 4
$(CH_3O)_3SiC_3H_6OCH_2$—$CF_2(OC_2F_4)_{p'}(OCF_2)_{q'}OCF_2$—$CH_2OC_3H_6Si(OCH_3)_3$
(p'/q'=0.9, p'+q'≈45, Weight-average molecular weight: 4,600)

Compound 5
$(CH_3O)_3SiC_3H_6OCH_2$—$CF_2(OC_2F_4)_{p'}(OCF_2)_{q'}OCF_2$—$CH_2OC_3H_6Si(OCH_3)_3$
(p'/q'=0.9, p'+q'≈23, Weight-average molecular weight: 2,600)

The polymer containing a fluorooxyalkylene group was selected from the commercial products specified below, which are available from Solvay Solexis Inc.

FOMBLIN Z03, consisting of about 45 recurring units and having a weight average molecular weight of 4,000.

FOMBLIN Z15, consisting of about 90 recurring units and having a weight average molecular weight of 8,000.

FOMBLIN Z25, consisting of about 100 recurring units and having a weight average molecular weight of 9,500.

Preparation of Surface Treating Agent and Formation of Cured Coating Film

Each of the silane modified with a polymer containing a fluorooxyalkylene group and each of the polymer containing a fluorooxyalkylene group, both specified in Table 1, were mixed in a ratio of 9:1 by weight. The resulting mixture was dissolved in Novec 7200 (from 3M Company) such that it gives a solution having a concentration of 20 wt %. Thus there were obtained samples of the surface treating agent desired. Each sample was applied to a glass substrate having a 15-nm thick top coating of $SiO_2$ ("Gorilla" made by Corning Inc.) by vacuum deposition at a pressure of $2.0 \times 10^{-2}$ Pa and at a temperature of 700° C. The amount of coating was 5 μL. The coating step was followed by curing at 25° C. for 24 hours in an atmosphere of 50% RH. Thus there was obtained the cured coating film desired which has a thickness of about 10 nm.

Each specimen of the cured coating film mentioned above was examined in the following way. The results are shown in Table 1.

[Examination for Water- and Oil-Repellency]

Each specimen was examined for water- and oil-repellency by measuring its contact angle formed by water and oleic acid, respectively, with the help of a contact angle meter ("Drop Master" made by Kyowa Interface Science Co., Ltd.).

[Examination for Surface Roughness Ra]

Each specimen was examined for surface roughness Ra by observation under an atomic force microscope (which is specified below).

Name: SPA-400 (made by SII Technology)
Mode of measurement: DFM (tapping mode)
Cantilever: S1-DF20 (without aluminum coating)
Area for measurement: 5 μm×5 μm

[Percent Defective]

Each of the specimens prepared as mentioned above was sprayed with saline solution by using the apparatus specified below. After spraying, the specimen was examined for contact angle formed by water in the same way as mentioned above. The specimens were rated as defective if their contact angle is below 100 degrees. This test was repeated ten times for each surface treating agent. The percent defective is defined as: (Number of defective specimens)/10×100

Name of apparatus: Saline solution spraying tester SQ-800-ST (made by ITABASHI RIKAKOGYO CO., LTD.)
Saline solution: 5 wt % aqueous solution of NaCl, at 35° C.
Duration of spray: 72 hours

TABLE 1

| | | Surface treating agent | | | Results of examination | | | |
|---|---|---|---|---|---|---|---|---|
| | | (A) Silane modified with a polymer containing fluorooxyalkylene group (wt %) | (B) Polymer containing fluorooxyalkylene group (wt %) | Ratio of weight average molecular weight of component (B) to weight average molecular weight of component (A) | Water-repellency (°) | Oil-repellency (°) | Ra (nm) | Percent defective (%) |
| Example | 1 | Compound 1 (18) | FOMBLIN Z15 (2) | 1.7 | 115 | 73 | 3.5 | 0 |
| | 2 | Compound 1 (18) | FOMBLIN Z25 (2) | 2.1 | 113 | 73 | 3.9 | 0 |
| | 3 | Compound 2 (18) | FOMBLIN Z15 (2) | 1.8 | 113 | 73 | 1.7 | 0 |
| | 4 | Compound 2 (18) | FOMBLIN Z25 (2) | 2.2 | 113 | 73 | 1.3 | 0 |
| | 5 | Compound 3 (18) | FOMBLIN Z15 (2) | 1.8 | 117 | 75 | 1.5 | 0 |
| | 6 | Compound 3 (18) | FOMBLIN Z25 (2) | 2.2 | 117 | 74 | 1.8 | 0 |
| | 7 | Compound 4 (18) | FOMBLIN Z15 (2) | 1.7 | 110 | 70 | 4.8 | 0 |
| | 8 | Compound 4 (18) | FOMBLIN Z25 (2) | 2.1 | 110 | 71 | 5.2 | 0 |
| | 9 | Compound 5 (18) | FOMBLIN Z03 (2) | 1.5 | 110 | 68 | 3.5 | 0 |
| | 10 | Compound 5 (18) | FOMBLIN Z15 2) | 3.1 | 112 | 71 | 3.8 | 0 |
| | 11 | Compound 5 (18) | FOMBLIN Z25 (2) | 3.7 | 112 | 72 | 3.5 | 0 |
| Comparative Example | 1 | Compound 1 (20) | | | 115 | 73 | 13.8 | 40 |
| | 2 | Compound 2 (20) | | | 112 | 72 | 10.3 | 30 |
| | 3 | Compound 3 (20) | | | 117 | 75 | 10.2 | 20 |
| | 4 | Compound 4 (20) | | | 110 | 70 | 15.8 | 30 |
| | 5 | Compound 5 (20) | | | 108 | 68 | 13.2 | 30 |
| | 6 | Compound 1 (18) | FOMBLIN Z03 (2) | 0.9 | 113 | 71 | 12.5 | 30 |
| | 7 | Compound 2 (18) | FOMBLIN Z03 (2) | 0.9 | 112 | 71 | 10.5 | 20 |
| | 8 | Compound 3 (18) | FOMBLIN Z03 (2) | 0.9 | 115 | 74 | 10.4 | 30 |
| | 9 | Compound 4 (18) | FOMBLIN Z03 (2) | 0.9 | 110 | 70 | 13.8 | 30 |

It is noted from Table 1 that the surface treating agent according to Comparative Examples 1 to 5, which is based on only component (A), i.e., the silane modified with a polymer containing a fluorooxyalkylene group, gives a coating film having a surface roughness exceeding 10 nm owing to polymer agglomeration. By contrast, the surface treating agent according to Examples 1 to 11, which is composed of component (A) and component (B), i.e., the polymer containing fluorooxyalkylene groups (in an amount of 10 wt % of the total amount), prevents the polymers from agglomerating each other, thereby invariably giving a smooth water- and oil-repellent coating film. Incidentally, this effect cannot be produced in the case of the surface treating agent according to Comparative Examples 6 to 9, in which component (B), i.e., the polymer containing a fluorooxyalkylene group has a weight average molecular weight which is up to that of component (A), i.e., the silane modified with a polymer containing a fluorooxyalkylene group.

The cured coating film according to Examples 1 to 11, which has a smooth surface, keeps its surface characteristic almost unchanged after spraying with saline solution. By contrast, the cured coating film according to Comparative Examples 1 to 9, which has a rough surface, remarkably decreases in contact angle (formed by water) after spraying with saline solution. In the case of specimens according to Comparative Examples 1 to 9, the cured coating film has a thickness of 10 nm on average. However, it fluctuates in thickness, leaving the substrate partly uncovered, so that it permits the $SiO_2$ layer (as the primer layer) to be attacked by saline solution. The complete covering of the $SiO_2$ layer may be accomplished by increasing the coating weight of the surface treating agent, but this is not desirable because the coated glass may possibly decrease in reflectance and transmittance.

INDUSTRIAL APPLICABILITY

The surface treating agent according to the present invention gives rise to a smooth cured coating film which excels in water- and oil-repellency. Therefore, it will be very effective in the field of applications, such as touch panel display and antireflective film, where it is necessary to avoid staining with sebum to ensure good visibility.

Japanese Patent Application No. 2011-261590 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A fluorine-based surface treating agent for vapor deposition, comprising (A) a hydrolyzable group-containing silane modified with a polymer containing a fluorooxyalkylene group and/or a partial hydrolytic condensate, and (B) a polymer containing a fluorooxyalkylene group having a higher weight average molecular weight than component (A), wherein components (A) and (B) are mixed in a weight ratio of from 6:4 to 9:1, and the ratio between the weight average molecular weight of component (A) and the weight average molecular weight of component (B) ranges from 1:1.5 to 1:5,
wherein the silane of component (A) is one represented by formula (2):

$$Rf\text{-}[\text{-}Q\text{-}X]_a \qquad (2)$$

wherein:
a is 1 or 2;
Rf is selected from the group consisting of formulae (3), (4), and (5) when letter a is 1:

 (3)

wherein Y is independently F or $CF_3$ group, m is an integer of 3 to 150, and d' is an integer of 1 to 3, $$C_3F_7O(CF_2CF_2CF_2O)_m C_{d'}F_{2d'} \qquad (4)$$

wherein m is an integer of 3 to 150 and d' is an integer of 1 to 3, and

 (5)

wherein Y is independently F or $CF_3$ group, Z is H or F, p and q each is an integer of 0 to 150, p+q is 3 to 150, d is an integer of 1 to 3, and the recurring units may be randomly joined together, or
Rf is selected from the group consisting of formulae (6), (7), and (8) when a is 2:

 (6)

wherein Y is independently F or $CF_3$ group, d' is independently an integer of 1 to 3, e is an integer of 2 to 6, each of r and t is an integer of 0 to 150, s is an integer of 0 to 6, and r+t+s is 3 to 150, and the recurring units may be randomly joined together,

 (7)

wherein m' is an integer of 3 to 150 and d is an integer of 1 to 3, and

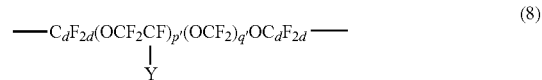 (8)

wherein Y is independently F or $CF_3$ group, d is independently an integer of 1 to 3, each of p' and q' is an integer of 0 to 150, and p'+q' is 3 to 150, and the recurring units may be randomly joined together;

Q is an unsubstituted or substituted divalent hydrocarbon group having 2 to 12 carbon atoms which contains at least one structure selected from the group consisting of amide linkage, ether linkage, ester linkage, vinyl linkage, and diorganosilylene group;

X is a monovalent organic group having a hydrolyzable group-containing silane and a plurality of hydrolyzable groups; and wherein the fluorooxyalkylene group-containing polymer of component (B) contains recurring units selected from the group consisting of:
—$CF_2O$—,
—$CF_2CF_2O$—,
—$CF_2CF_2CF_2O$—
—$CF(CF_3)CF_2O$—,
—$CF_2CF_2CF_2CF_2O$—,
—$CF_2CF_2CF_2CF_2CF_2CF_2O$—, and
—$C(CF_3)_2O$— in combination with one another and contains no terminal hydrolysable groups, wherein the number of recurring units is 5 to 755.

2. The fluorine-based surface treating agent of claim 1, wherein Q is selected from the group consisting of:

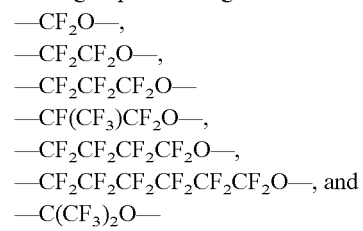

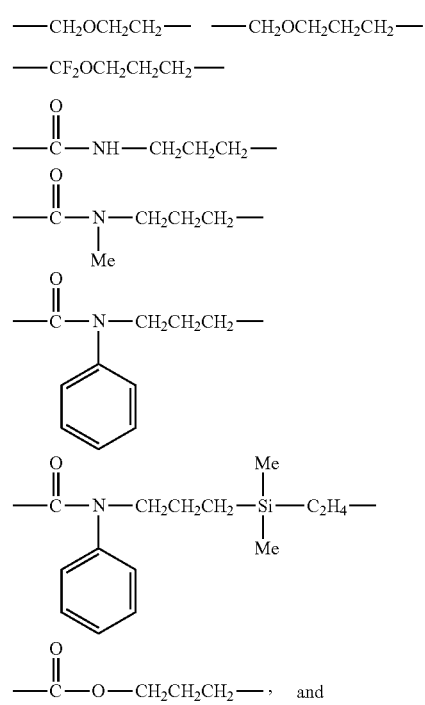

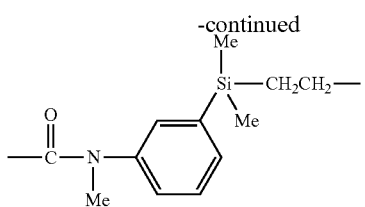

wherein Me is a methyl group.

3. The fluorine-based surface treating agent of claim 1, wherein X is a hydrolyzable silyl group, or a linear, branched or cyclic siloxane group or silyl group having a hydrolyzable silyl group or hydrolyzable silylalkylene group.

4. The fluorine-based surface treating agent of claim 1, wherein X is a group having an alkoxy group-bonded silyl group represented by any one of the following formulas:

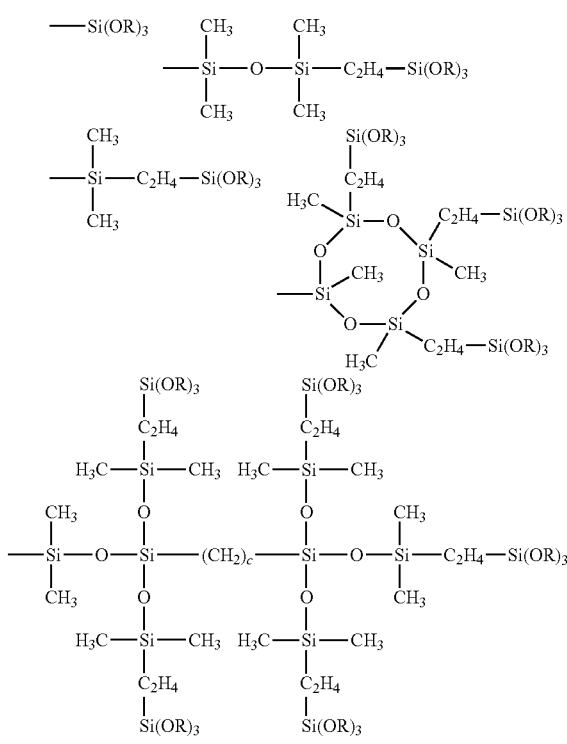

wherein letter c is an integer of 2 to 6, and OR is an alkoxy group having 1 to 10 carbon atoms, an alkoxyalkoxy group having 2 to 10 carbon atoms, an alkenyloxy group having 2 to 10 carbon atoms, or an acyloxy group having 1 to 10 carbon atoms.

5. The fluorine-based surface treating agent of claim 1, wherein the fluorooxyalkylene group-containing polymer of component (B) is selected from the group consisting of a polymer having formula (9) and a polymer having formula (10):

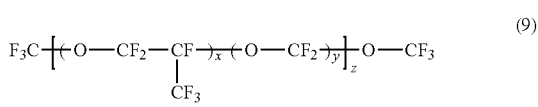

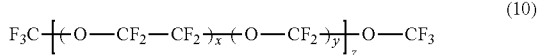

wherein x, y and z are values satisfying that the weight average molecular weight of the fluorooxyalkylene group-containing polymer is 1,500 to 20,000.

6. The fluorine-based surface treating agent of claim 1, which further comprises a fluorine-modified ether solvent or a fluorine-modified aromatic hydrocarbon solvent.

7. An article treated by vapor deposition with the surface treating agent of claim 1.

8. An optical article treated by vapor deposition with the surface treating agent of claim 1.

9. A touch panel treated by vapor deposition with the surface treating agent of claim 1.

10. Antireflective film treated by vapor deposition with the surface treating agent of claim 1.

11. SiO$_2$-treated glass treated by vapor deposition with the surface treating agent of claim 1.

12. Tempered glass treated by vapor deposition with the surface treating agent of claim 1.

* * * * *